(12) United States Patent
Wang et al.

(10) Patent No.: US 7,839,174 B2
(45) Date of Patent: Nov. 23, 2010

(54) MIXED-VOLTAGE TOLERANT I/O BUFFER AND OUTPUT BUFFER CIRCUIT THEREOF

(75) Inventors: Chua-Chin Wang, Kaohsiung (TW);
Tzung-Je Lee, Kaohsiung (TW);
Yi-Cheng Liu, Kaohsiung (TW);
Kuo-Chan Huang, Sinshih Township, Tainan County (TW)

(73) Assignees: Himax Technologies Limited, Sinshih Township, Tainan County (TW);
National Sun Yat-Sen University, Kaohsiung (TW)

( * ) Notice: Subject to any disclaimer, the term of this patent is extended or adjusted under 35 U.S.C. 154(b) by 8 days.

(21) Appl. No.: 12/330,768

(22) Filed: Dec. 9, 2008

(65) Prior Publication Data

US 2010/0141324 A1 Jun. 10, 2010

(51) Int. Cl.
*H03K 19/094* (2006.01)
(52) U.S. Cl. .............................. 326/83; 326/87; 326/26
(58) Field of Classification Search .................. 326/68, 326/80, 81, 83, 87, 26; 327/333, 112
See application file for complete search history.

(56) References Cited

U.S. PATENT DOCUMENTS 6,018,267 A * 1/2000 Tran et al. .................... 330/253
6,323,704 B1 * 11/2001 Pelley et al. ................. 327/112
6,351,358 B1 * 2/2002 Allen ........................... 361/90
6,586,974 B1 * 7/2003 Humphrey et al. .......... 327/108
7,112,996 B2 * 9/2006 Lee ............................... 326/68

* cited by examiner

*Primary Examiner*—Rexford N Barnie
*Assistant Examiner*—Crystal L Hammond
(74) *Attorney, Agent, or Firm*—Thomas, Kayden, Horstemeyer & Risley, LLP (57) ABSTRACT

An output buffer circuit includes a high voltage detecting circuit, a dynamic gate bias generating circuit, an output stage circuit and a pad voltage detector. The high voltage detecting circuit detects a power supply voltage and generates a first and a second determining signals and a first and a second bias voltages according to the power supply voltage. The dynamic gate bias generating circuit is biased by the first and the second bias voltages and receives the first and the second determining signals, for converting logic control signals into corresponding gate bias voltages according to the first and the second determining signals. The pad voltage detector detects a voltage of an I/O pad and provides a pad voltage detecting signal for the output stage circuit to modify an output signal outputted to an I/O pad. A mixed-voltage input/output (I/O) buffer is disclosed herein.

39 Claims, 6 Drawing Sheets

MIXED-VOLTAGE TOLERANT I/O BUFFER AND OUTPUT BUFFER CIRCUIT THEREOF

BACKGROUND

1. Field of Invention

The present invention relates to a buffer circuit. More particularly, the present invention relates to a mixed-voltage tolerant input/output (I/O) buffer in a semiconductor integrated circuit.

2. Description of Related Art

Integrated circuits (IC) are capable of being used nowadays to perform a wide variety of tasks. By packing many circuits onto the chip or integrating different circuits for different applications into one device, the total capabilities of the IC can be thus increased. Although the capabilities of the IC can be increased, different circuits may be operated at different voltages. For example, a system memory utilizes a voltage of 3.3 V and employs the same bus as the 5 V circuit, or the chip outputting an output voltage of 5V drives another chip powered by a power voltage of 1.8 V or 3.3 V. Therefore, a mixed-voltage tolerant I/O buffer is a necessary interface for communication between signals with different voltage levels.

However, the conventional mixed-voltage I/O buffer, which has an output stage circuit consisting of one PMOS transistor and one NMOS transistor or consisting of stacked NMOS transistors, is usually provided to transmit signals with limited voltage levels. If the mixed-voltage I/O buffer is going to be used as an interface to transmit the signal with a high voltage level (e.g. 2×VDD) or the signal with a low voltage level (e.g. 0.5×VDD), the output stage circuit will suffer from problems such as gate-oxide overstress, hot-carrier degradation and unpredictable leakage currents. As a result, the semiconductor device will have reliability problems.

SUMMARY

In accordance with one embodiment of the present invention, an output buffer circuit is provided. The output buffer circuit includes a high voltage detecting circuit, a dynamic gate bias generating circuit, an output stage circuit and a pad voltage detector. The high voltage detecting circuit detects a power supply voltage and generates a first and a second determining signals and a first and a second bias voltages according to the power supply voltage. The dynamic gate bias generating circuit is biased by the first and the second bias voltages and receives the first and the second determining signals, for converting logic control signals into corresponding gate bias voltages according to the first and the second determining signals. The output stage circuit includes a plurality of stacked transistors biased by the gate bias voltages, for outputting an output signal with a corresponding voltage level to an I/O pad. The pad voltage detector detects a voltage of the I/O pad and provides a pad voltage detecting signal for the output stage circuit to modify the output signal outputted to the I/O pad.

In accordance with another embodiment of the present invention, a mixed-voltage input/output (I/O) buffer is provided. The mixed-voltage I/O buffer includes an output buffer circuit for buffering signals from a core circuit to an I/O pad under a transmitting mode and an input buffer circuit for buffering signals from the I/O pad to the core circuit under a receiving mode. The output buffer circuit includes a high voltage detecting circuit, a dynamic gate bias generating circuit and an output stage circuit. The high voltage detecting circuit detects a power supply voltage and generates a first and a second determining signals and a first and a second bias voltages according to the power supply voltage. The dynamic gate bias generating circuit is biased by the first and the second bias voltages and receives the first and the second determining signals, for converting logic control signals into corresponding gate bias voltages according to the first and the second determining signals. The output stage circuit includes a plurality of stacked transistors biased by the gate bias voltages, for outputting an output signal with a corresponding voltage level to the I/O pad.

In accordance with yet another embodiment of the present invention, an output buffer circuit is provided. The output buffer circuit includes a high voltage detecting circuit, a dynamic gate bias generating circuit, an output stage circuit, a gate-tracking circuit and a floating N-well circuit. The high voltage detecting circuit detects a power supply voltage and generates a first and a second determining signals and a first and a second bias voltages according to the power supply voltage. The dynamic gate bias generating circuit is biased by the first and the second bias voltages and receives the first and the second determining signals, for converting logic control signals into corresponding gate bias voltages according to the first and the second determining signals. The output stage circuit includes stacked P-type transistors biased by the gate bias voltages, for outputting an output signal with a corresponding voltage level to an I/O pad. The gate-tracking circuit tracks voltage of the I/O pad and provides gate voltages for the output stage circuit according to the voltage of the I/O pad. The floating N-well circuit provides N-well voltages for at least one N-well of the stacked P-type transistors and at least one N-well of P-type transistors of the gate-tracking circuit.

In accordance with still another embodiment of the present invention, a mixed-voltage input/output (I/O) buffer is provided. The mixed-voltage I/O buffer includes an output buffer circuit for buffering signals from a core circuit to an I/O pad under a transmitting mode and an input buffer circuit for buffering signals from the I/O pad to the core circuit under a receiving mode. The output buffer circuit includes a high voltage detecting circuit, a dynamic gate bias generating circuit, an output stage circuit, a gate-tracking circuit, a floating N-well circuit and a pad voltage detector. The high voltage detecting circuit detects a power supply voltage and generates a first and a second determining signals and a first and a second bias voltages according to the power supply voltage. The dynamic gate bias generating circuit is biased by the first and the second bias voltages and receives the first and the second determining signals, for converting logic control signals into corresponding gate bias voltages according to the first and the second determining signals. The output stage circuit includes stacked P-type transistors biased by the gate bias voltages, for outputting an output signal with a corresponding voltage level to the I/O pad. The gate-tracking circuit tracks voltage of the I/O pad and provides gate voltages for the output stage circuit according to the voltage of the I/O pad. The floating N-well circuit provides N-well voltages for at least one N-well of the stacked P-type transistors and at least one N-well of P-type transistors of the gate-tracking circuit. The pad voltage detector detects the voltage of the I/O pad and modifies the output signal outputted to the I/O pad.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
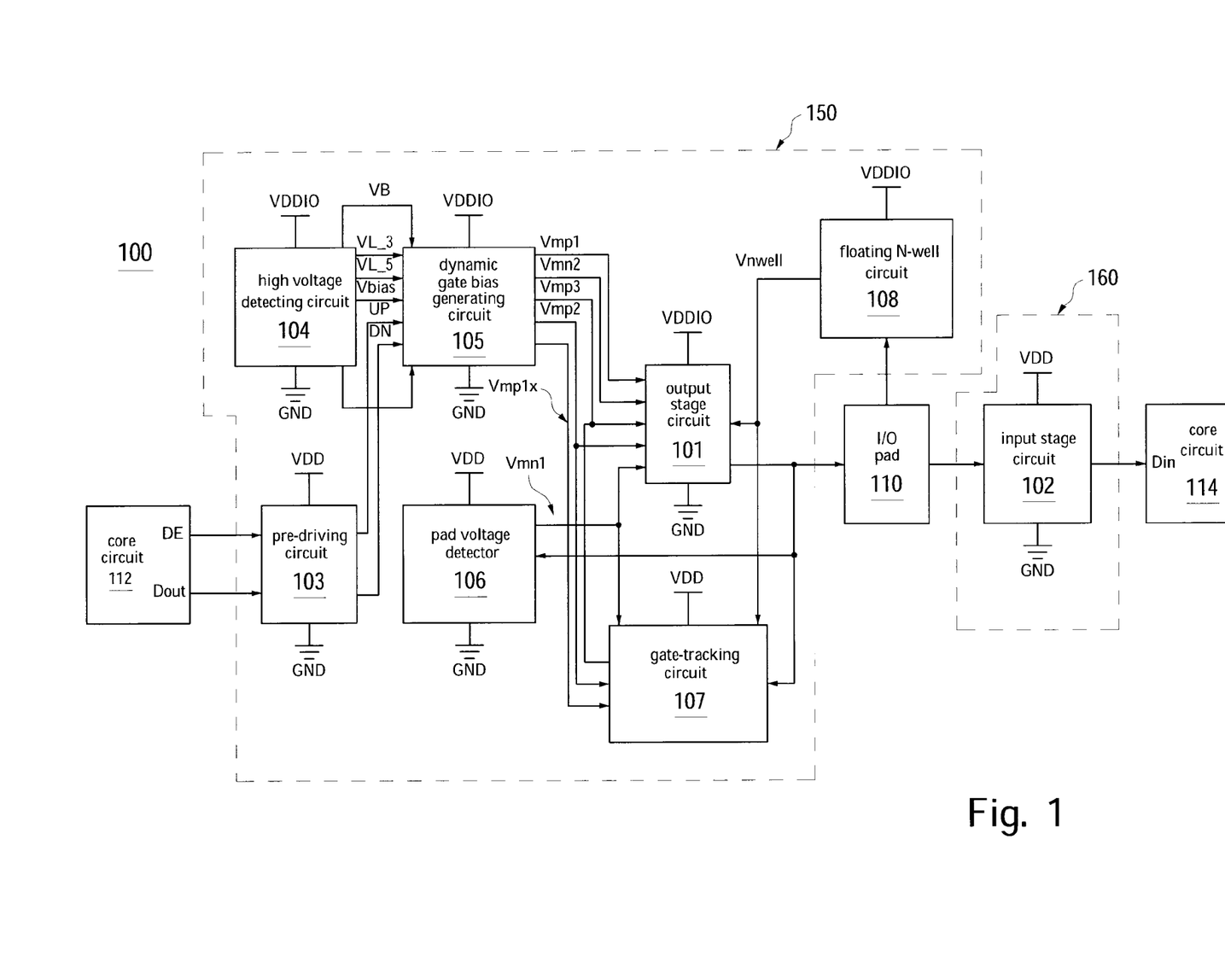
FIG. 1 illustrates a block diagram of the mixed-voltage input/output (I/O) buffer according to one embodiment of the present invention.

FIG. 1 illustrates a block diagram of the mixed-voltage input/output (I/O) buffer according to one embodiment of the present invention. The mixed-voltage I/O buffer 100 includes an output buffer circuit 150 and an input buffer circuit 160. The mixed-voltage I/O buffer 100 is employed with two high-voltage-level power supply voltages VDD and VDDIO, in which VDD is 1.8 V and VDDIO can be 5.0/3.3/1.8/1.2/0.9 V. The output buffer circuit 150 buffers signals from a core circuit 112 to an I/O pad 110 under a transmitting mode. Therefore, digital signals with desired voltage levels corresponding to logic 1 or 0 can be outputted to the I/O pad 110. On the other hand, the input buffer circuit 160, including an input stage circuit 102, buffers signals from the I/O pad 110 to another core circuit 114 under a receiving mode. Therefore, the digital signals with desired voltage levels corresponding to logic 1 or 0 can be inputted into the core circuit 114. The core circuit 112 receiving the signals from the I/O pad 110 may be the same as or different from the core circuit 114 transmitting the signals to the I/O pad 110.

As illustrated in FIG. 1, the output buffer circuit 150 includes a pre-driving circuit 103, a high voltage detecting circuit 104, a dynamic gate bias generating circuit 105, a pad voltage detector 106, an output stage circuit 101, a gate-tracking circuit 107 and a floating N-well circuit 108. The pre-driving circuit 103 is a digital logic circuit capable of outputting logic control signals UP and DN and determining that the mixed-voltage I/O buffer 100 operates under the transmitting mode or the receiving mode. The high voltage detecting circuit 104 detects VDDIO and generates two determining signals (i.e. VL_3, VL_5) and two bias voltages (i.e. VB and Vbias) according to VDDIO. The dynamic gate bias generating circuit 105 is biased by VB and Vbias and receives the determining signals VL_3 and VL_5, and thus converts the logic control signals UP and DN into corresponding gate bias voltages (e.g. Vmp1, Vmp2, Vmp3, Vmn2), for the output stage circuit 101, according to the determining signals VL_3 and VL_5. The pad voltage detector 106 detects the voltage of the I/O pad 110 and provides a pad voltage detecting signal Vmn1 for the output stage circuit 101 in order to tune the output signal (or output voltage) delivered to the I/O pad 110. The output stage circuit 101, including stacked P-type transistors and stacked N-type transistors, is then biased by the gate bias voltages Vmp1, Vmp2, Vmp3 and Vmn2 and accordingly outputs an output signal with a corresponding voltage level to the I/O pad 110. The gate-tracking circuit 107 tracks the voltage of the I/O pad 110 and provides gate voltages for the output stage circuit 101 according to the voltage of the I/O pad 110. The floating N-well circuit 108 provides N-well voltages for at least one N-well of the stacked P-type transistors of the output stage circuit 101 and at least one N-well of P-type transistors of the gate-tracking circuit 107.

The dynamic gate bias generating circuit 105 and the pad voltage detector 106 both can provide appropriate gate voltages for the output stage circuit 101 such that the output stage circuit 101 can be prevented from reliability problems. Furthermore, the output stage circuit 101 can be prevented from having gate-oxide overstress and leakage current, with the aid of the gate-tracking circuit 107 and the floating N-well circuit 108.

Figure 2:
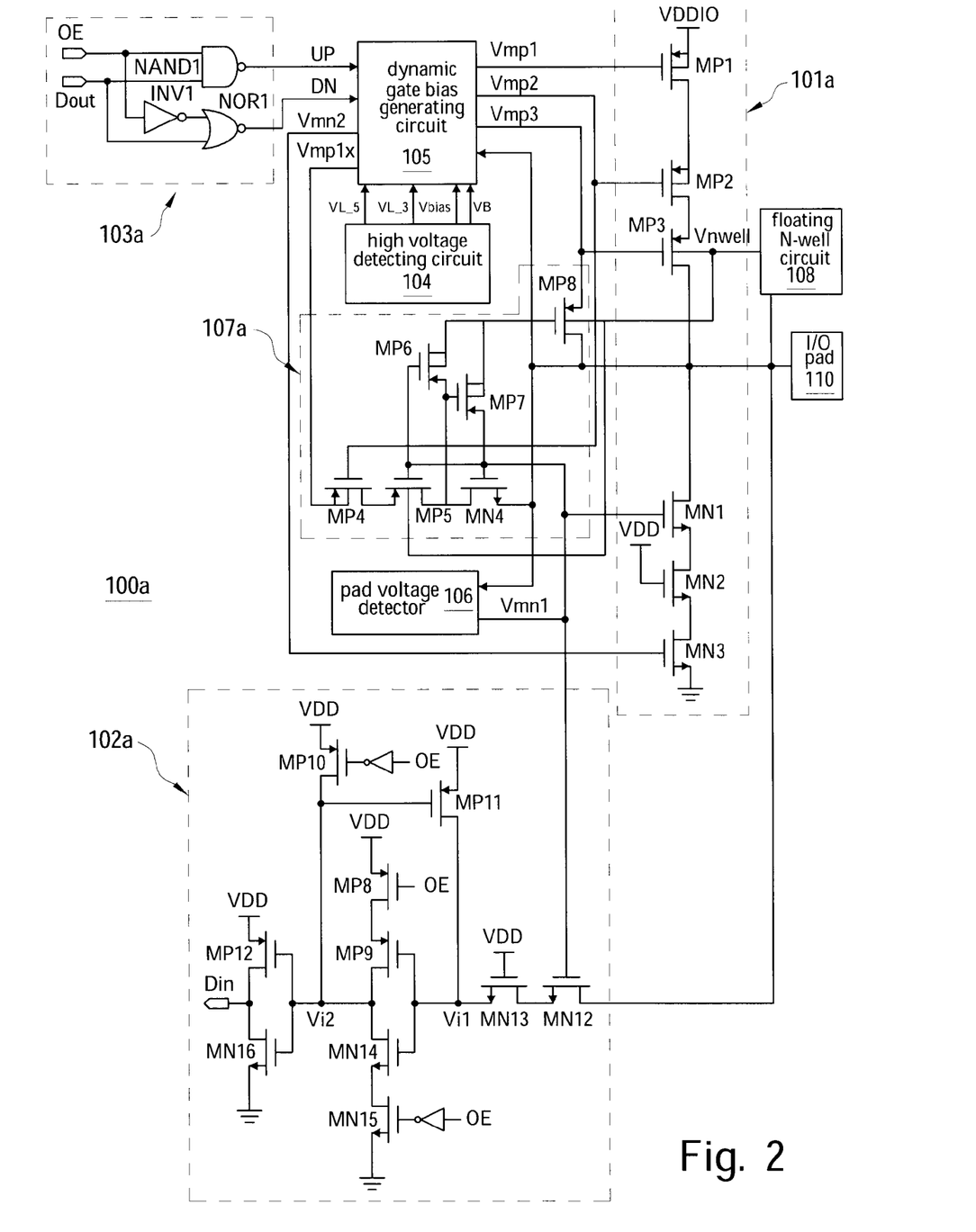
FIG. 2 illustrates a circuit diagram of the mixed-voltage I/O buffer shown in FIG. 1 according to one embodiment of the present invention.

FIG. 2 illustrates a circuit diagram of the mixed-voltage I/O buffer shown in FIG. 1 according to one embodiment of the present invention. Detailed circuits of the pre-driving circuit 103a, the gate-tracking circuit 107a and the output stage circuit 101a in the output buffer circuit, and the input stage circuit 102a in the output buffer circuit are shown in FIG. 2. The pre-driving circuit 103a governs the operation mode of the mixed-voltage I/O buffer 100a. The pre-driving circuit 103a receives an enable signal OE and an output signal Dout and includes an inverter INV1, a NAND logic gate NAND1 and a NOR logic gate NOR1. The logic gate NAND1 receives an enable signal OE and an output signal Dout, and thus outputs the logic control signal UP. The logic gate NOR1 receives the enable signal OE through INV1 and the output signal Dout, and thus outputs the logic control signal DN. If the enable signal OE is logic 1, the mixed-voltage I/O buffer 100a operates under the transmitting mode. At that moment, the I/O pad 110 receives the signal with the same logic as the output signal Dout. On the other hand, if the enable signal OE is logic 0, the mixed-voltage I/O buffer 100a operates under the receiving mode. At that moment, the input signal Din transmits the signal with the same logic as the I/O pad 110.

TABLE I

|  | IN | | OUT | |
| --- | --- | --- | --- | --- |
|  | OE | Dout | UP | DN |
| Receiving | 0 | 0 | 1 | 0 |
|  | 0 | 1 | 1 | 0 |
| Transmitting | 1 | 0 | 1 | 1 |
|  | 1 | 1 | 0 | 0 |

Table I shows a truth table with two inputs (OE and Dout) and two outputs (UP and DN) of the pre-driving circuit 222. As shown in Table I, if OE is logic 0 (e.g. 0 V), UP will be logic 1 (e.g. 3.3 V) and DN will be logic 0 no matter what Dout is, such that the output stage circuit 101 turns off and the mixed-voltage I/O buffer 100a operates under the receiving mode. When OE is logic 1, UP and DN will be in inverse relation to Dout and fed into the dynamic gate bias generating circuit 105. Then, the dynamic gate bias generating circuit 105 provides corresponding gate bias voltages for the output stage circuit 101 and the mixed-voltage I/O buffer 100a operates under the transmitting mode.

The output stage circuit 101a includes three pull-up PMOS transistors (MP1, MP2, MP3) stacked one by one and three pull-down NMOS transistors (MN1, MN2, MN3) stacked one by one, in which the I/O pad 110 and the drains of MP3 and MN1 are coupled with each other. Gate voltages of the transistors MP1, MP2, MP3, MN1, and MN3 are controlled by the dynamic gate bias generating circuit 105 and the pad voltage detector 106, so as to avoid reliability problems. Moreover, the transistor MP3 is further controlled by the gate-tracking circuit 107a and the floating N-well circuit 108 under the receiving mode, so as to avoid leakage current. Due to the co-existence of the stacked pull-up PMOS transistors and the stacked pull-down NMOS transistors, VDDIO can be switched to 5.0/3.3/1.8/1.2/0.9V, thereby accordingly changing the voltage level of the I/O pad 110.

The gate-tracking circuit 107a is turned on or off according to the voltage signal Vmp1x and the gate bias voltage generated from the dynamic gate bias generating circuit 105, the pad voltage detecting signal Vmn1 provided by the pad voltage detector 106, and the voltage of the I/O pad 110.

Under the transmitting mode, if logic 1 is transmitted and VDDIO is 5.0/3.3 V, Vmp1x is then 5.0/3.3V, Vmp2 is 3.3/1.8 V, Vmn1 is 3.3/1.8 V, and the gate voltage of MP8 is charged through MP4, MP5 and MP6 to 5.0/3.3 V, so as to prevent the gate-tracking circuit 107a from turning on under the transmitting mode and to prevent Vmp3 from being affected by the I/O pad voltage.

Under the receiving mode, if the input signal from the I/O pad 110 has a voltage level of 5.0/3.3 V, Vmn1 will be 3.3/1.8 V and MP7 will turn on such that the gate voltage level of MP3 is as same as the voltage level of the input signal from the I/O pad 110 and MP7 has no gate-oxide overstress, thereby preventing MP3 from generating leakage current.

Under the receiving mode, if the input signal from the I/O pad 110 has a voltage level of 1.8/1.2/0.9/0 V, Vmn1 will be 1.8 V and MP7 will turn on such that MP8 has a gate voltage of 1.8 V and thus turns off.

The input stage circuit 102a transmits the input signal from the I/O pad 110 to the core circuit and converts logic 1 into a voltage level of 1.8 V when the I/O buffer 100a operates under the receiving mode. When the I/O pad 110 receives the signal with a voltage level of 5.0/3.3 V, the node Vi1 is pulled down through MN12 and MN13 to about 1.4 V and cause MN14 no reliability problem, and MP11 can thus pulls up the input signal of logic 1 to VDD (or 1.8 V).

When the input signal from the I/O pad 110 is logic 1 (0.9/1.2/1.8/3.3/5.0 V) and transmitted through the inverter consisting of MP9 and MN14, the node Vi2 is 0 V and MP11 turns on to pull up the node Vi1 to VDD, so that the inverter consisting of MP9 and MN14 generates no leakage current.

When the I/O buffer 100a operates under the transmitting mode, OE is 1.8 V such that MP8 and MN15 turn off, MP10 turns on, the node Vi2 is charged to 1.8 V to turn off MP11, thereby preventing the input stage circuit 102a generating leakage current under the transmitting mode.

Figure 3:
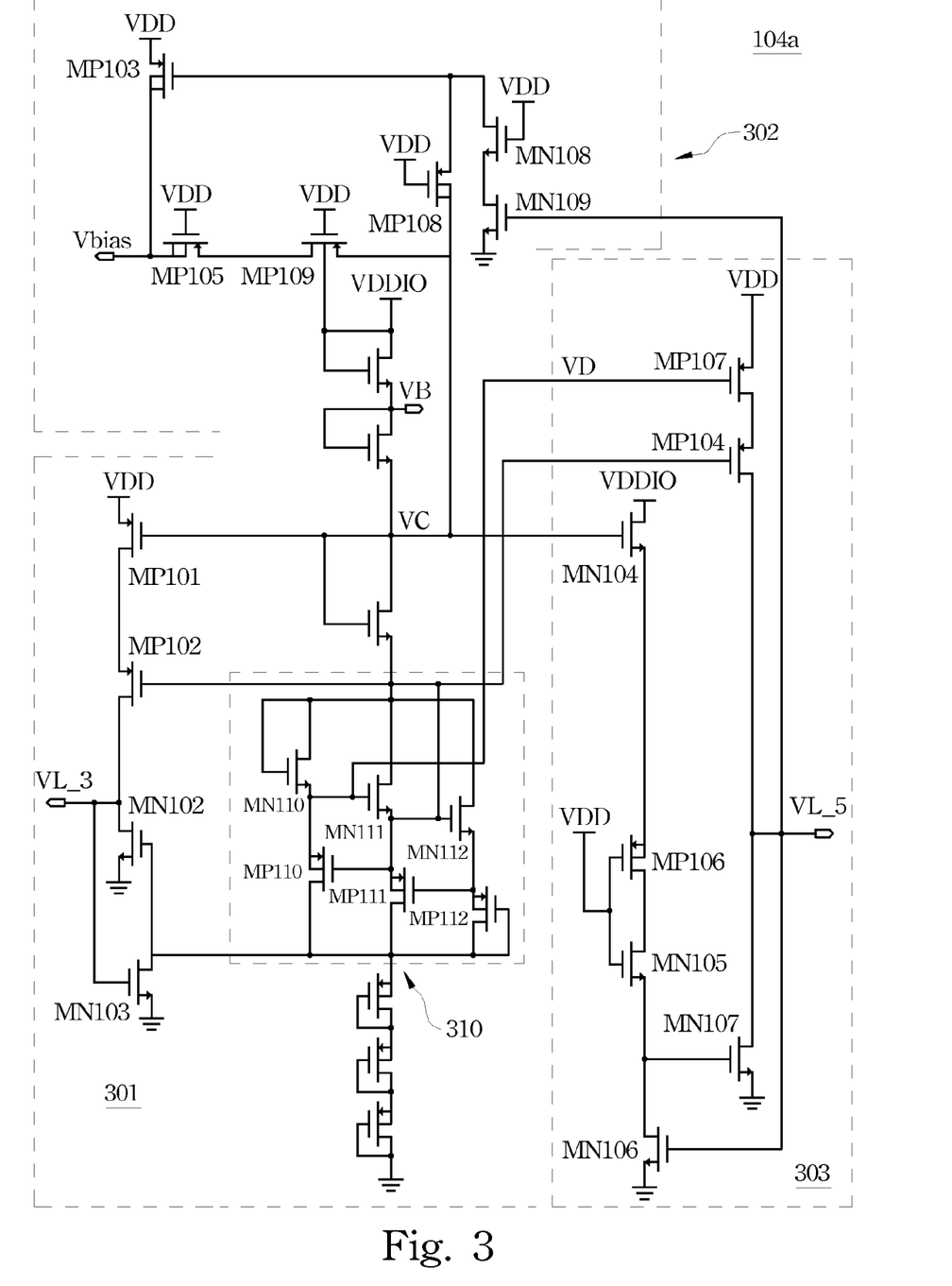
FIG. 3 illustrates a circuit diagram of the high voltage detecting circuit shown in FIG. 2 according to one embodiment of the present invention.

FIG. 3 illustrates a circuit diagram of the high voltage detecting circuit shown in FIG. 2 according to one embodiment of the present invention. The high voltage detecting circuit 104a includes a low power bias circuit 302 and two sub-voltage detecting circuit, i.e., sub-2VDD detecting circuit 301 and sub-3VDD detecting circuit 303. The sub-2VDD detecting circuit 301 detects if the power supply voltage VDDIO is a first sub-voltage (e.g. 3.3 V) and outputs the determining signal VL_3 to the dynamic gate bias generating circuit 105. The sub-3VDD detecting circuit 303 detects if the power supply voltage VDDIO is a second sub-voltage (e.g. 5.0 V) and outputs the determining signal VL_5 to the dynamic gate bias generating circuit 105. The low power bias circuit 302 generates the bias voltages Vbias and VB in accordance with the power supply VDDIO, and includes a closed-loop circuit mainly consisting of the transistors MN110, MN111, MN112, MP110, MP111 and MP112, where the transistors all operate in the sub-threshold region and the quiescent current thereof is minimized without any start-up circuit. Detailed circuits of the low power bias circuit 302, the sub-2VDD detecting circuit 301 and the sub-3VDD detecting circuit 303 are shown in FIG. 3.

TABLE II

| VDDIO | Vbias | VL_5 | VL_3 |
|---|---|---|---|
| 5.0 V | 3.3 V | 0 V | 0 V |
| 3.3 V | 1.8 V | 1.8 V | 0 V |
| 1.8 V | 1.8 V | 1.8 V | 1.8 V |
| 1.2 V | 1.8 V | 1.8 V | 1.8 V |
| 0.9 V | 1.8 V | 1.8 V | 1.8 V |

The operation of the high voltage detecting circuit 104a, corresponding to VDDIO (5.0/3.3/1.8/1.2/0.9 V), is described as follows. Table II shows the values of VDDIO and the corresponding values of Vbias, VL_5 and VL_3. When VDDIO is 5.0 V, for the sub-3VDD detecting circuit 303, the transistors MP106, MN105 and MN104 turn on, so that MN107 turns on to pull down the signal VL_5 to 0 V and MN106 thus turns off. At that moment, the voltage of the node VD (i.e. gate voltage of MP107) is approximately 2.2 V so that MP107 turns off. Moreover, for the sub-2VDD detecting circuit 301, the transistor MN102 turns off to pull down the signal VL_3 to 0 V and MN103 thus turns off. At that moment, the voltage of the node VC (i.e. gate voltage of MP101) is approximately 3.3 V so that MP101 turns off without suffering gate oxide overstress.

When VDDIO is 3.3 V, for the sub-3VDD detecting circuit 303, MP106 turns off, and MP104 and MP107 turns on to pull up the signal VL_5 to VDD (i.e. 1.8 V), so that MN106 turns on and MN107 turns off. Moreover, for the sub-2VDD detecting circuit 301, MN102 turns on to pull down the signal VL_3 to 0 V and MN103 thus turns off. At that moment, the voltage of the node VC (i.e. gate voltage of MP101) is approximately 3.3 V so that MP101 turns off.

When VDDIO is 1.8/1.2/0.9 V for the sub-3VDD detecting circuit 303, MP106 turns off, and MP104 and MP107 turns on to pull up the signal VL_5 to VDD (i.e., 1.8 V). Then, MN106 turns on and MN107 turns off. Moreover, for the sub-2VDD detecting circuit 301, MP102 and MP101 turns on to pull up the signal VL_3 to VDD (i.e. 1.8 V) such that MN102 turns off. Therefore, when VDDIO is 5.0/3.3/1.8/1.2/0.9 V, the high voltage detecting circuit 104a can accordingly output the determining signal VL_5 with corresponding voltage level of 0/1.8/1.8/1.8/1.8 V and the determining signal VL_3 with corresponding voltage level of 0/0/1.8/1.8/1.8 V.

Figure 4:
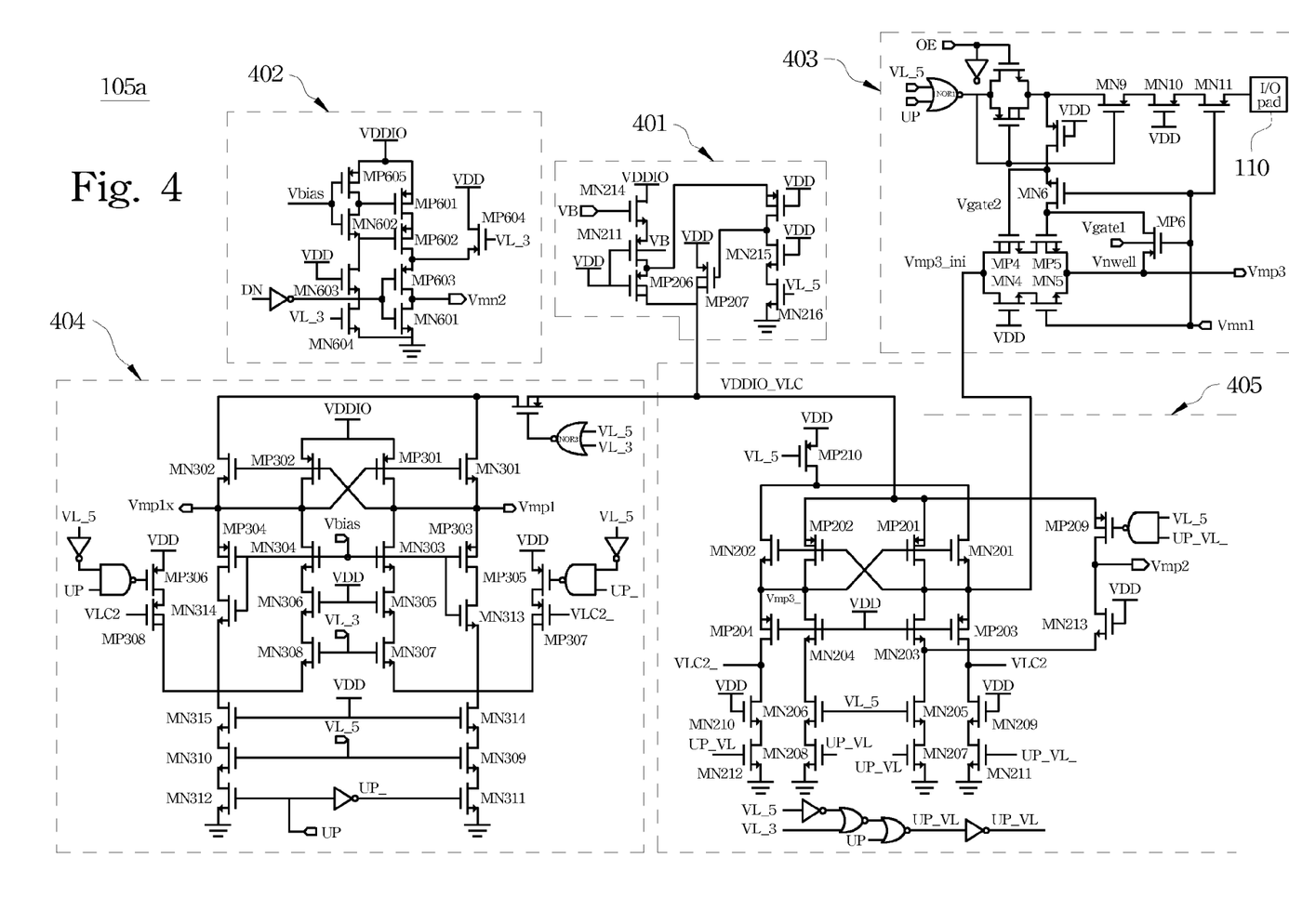
FIG. 4 illustrates a circuit diagram of the dynamic gate bias generating circuit shown in FIG. 2 according to one embodiment of the present invention.

FIG. 4 illustrates a circuit diagram of the dynamic gate bias generating circuit shown in FIG. 2 according to one embodiment of the present invention. The dynamic gate bias generating circuit 105a includes a power supply detecting level converter 401, a dynamic detecting converter 402, an electrical overstress (EOS) protector 403, a sub-3VDD level converter 404 and a sub-2VDD level converter 405, and provides appropriate gate voltages (i.e. Vmp1, Vmp2, Vmp3, Vmn2) for the output stage circuit 101a to prevent the transistors MP1, MP2, MP3 and MN3 from reliability problems. The dynamic detecting converter 402 is biased by Vbias and converts the logic control signal DN, according to VL_3 and VDDIO, into the gate bias voltage Vmn2 for biasing the transistor MN3, as shown in FIG. 2. The EOS protector 403 keeps the dynamic gate bias generating circuit 105a from a high voltage of the I/O pad. The power supply detecting level converter 401 is biased by VB and receives VL_5, and generates a conversion voltage VDDIO_VLC corresponding to VDDIO (VDDIO_VLC also referring to the node where sub-3VDD level converter 404, sub-2VDD level converter 405 and power supply detecting level converter 401 are coupled with each other). The sub-3VDD level converter 404 receives the conversion voltage VDDIO_VLC and converts the voltage level of UP into a corresponding sub-voltage level according to the conversion voltage VDDIO_VLC. The sub-3VDD level converter 404 further generates complementary voltage signals (i.e. Vmp1 and Vmp1x). The sub-2VDD level converter 405 receives the conversion voltage VDDIO_VLC and converts the voltage level of UP into another corresponding sub-voltage level according to the conversion voltage VDDIO_VLC.

is 0.9/1.2/1.8/3.3/5.0 V such that MP1 turns on without gate-oxide overstress. Similarly, Vmp2 and Vmp3 are 0/0/0/1.8/3.3 V such that MP2 and MP3 turn on without gate-oxide overstress. Furthermore, Vmn2 is 0.9/1.2 V when VDDIO is 0.9/1.2 V so as to decrease the driving ability of the stacked NMOS transistors MN1, MN2 and MN3, such that the output stage circuit 101a can output the signal with almost 50% duty cycle.

Under the receiving mode (OE=0 V), Vmp1, Vmp2 and Vmp3 are the same as that of logic 0 transmitted by the mixed-voltage I/O buffer 100a such that all the charging paths are closed. Notably, when the I/O pad 110 receives the signal with voltage level of 5.0/3.3 V, Vmp3 is charged by the gate-tracking circuit 107a and pulled up to 5.0/3.3 V, so as to prevent MP3 from turning on and generating leakage current.

Detailed circuits of the power supply detecting level converter 401, the dynamic detecting converter 402, the electrical overstress (EOS) protector 403, the sub-3VDD level converter 404 and the sub-2VDD level converter 405 are shown in FIG. 4.

The power supply detecting level converter 401 generates the conversion voltage VDDIO_VLC varying with the power supply VDDIO. When VDDIO is 5.0 V, MP206 and MP211 turn on such that VDDIO_VLC is charged to 3.3 V ($\approx$VB–$V_{TH\_MN214}$). Accordingly, MP208 turns on and MP207 turns off and leakage current can be avoided. When VDDIO is 0.9/1.2/1.8/3.3 V, VL_5 is 1.8 V and MN216 turns on to pull

TABLE III

| OE | VDDIO | UP | VL_5 | VL_3 | Vmp1 | Vmp2 | Vmp3 | Vmp1x | Vmn2 |
|---|---|---|---|---|---|---|---|---|---|
| 1.8 V | 5.0 V | 0 V | 0 V | 0 V | 3.3 V | 3.3 V | 3.3 V | 5.0 V | 0 V |
|  |  | 1.8 V |  |  | 5.0 V | 3.3 V | 1.8 V | 3.3 V | 1.8 V |
|  | 3.3 V | 0 V | 1.8 V | 0 V | 1.8 V | 1.8 V | 1.8 V | 3.3 V | 0 V |
|  |  | 1.8 V |  |  | 3.3 V | 1.8 V | 1.8 V | 1.8 V | 1.8 V |
|  | 1.8 V | 0 V | 1.8 V | 1.8 V | 0 V | 0 V | 0 V | 1.8 V | 0 V |
|  |  | 1.8 V |  |  | 1.8 V | 1.8 V | 1.8 V | 0 V | 1.8 V |
|  | 1.2 V | 0 V | 1.8 V | 1.8 V | 0 V | 0 V | 0 V | 1.2 V | 0 V |
|  |  | 1.8 V |  |  | 1.2 V | 1.8 V | 1.8 V | 0 V | 1.2 V |
|  | 0.9 V | 0 V | 1.8 V | 1.8 V | 0 V | 0 V | 0 V | 0.9 V | 0 V |
|  |  | 1.8 V |  |  | 0.9 V | 1.8 V | 1.8 V | 0 V | 0.9 V |

| OE | VDDIO | UP | PAD | Vmp1 | Vmp2 | Vmp3 | Vmp1x | Vmn1 | Vmn2 |
|---|---|---|---|---|---|---|---|---|---|
| 0 V | 5.0 V | 1.8 V | 0 V | 5.0 V | 3.3 V | 1.8 V | 3.3 V | 1.8 V | 0 V |
|  |  |  | 5.0 V | 5.0 V | 3.3 V | 5.0 V* | 3.3 V | 3.3 V | 0 V |
|  | 3.3 V | 1.8 V | 0 V | 3.3 V | 1.8 V | 1.8 V | 1.8 V | 1.8 V | 0 V |
|  |  |  | 3.3 V | 3.3 V | 1.8 V | 3.3 V* | 1.8 V | 2.2 V | 0 V |
|  | 1.8 V | 1.8 V | 0 V | 1.8 V | 1.8 V | 1.8 V | 0 V | 1.8 V | 0 V |
|  |  |  | 1.8 V | 1.8 V | 1.8 V | 1.8 V | 0 V | 1.8 V | 0 V |
|  | 1.2 V | 1.8 V | 0 V | 1.2 V | 1.8 V | 1.8 V | 0 V | 1.8 V | 0 V |
|  |  |  | 1.2 V | 1.2 V | 1.8 V | 1.8 V | 0 V | 1.8 V | 0 V |
|  | 0.9 V | 1.8 V | 0 V | 0.9 V | 1.8 V | 1.8 V | 0 V | 1.8 V | 0 V |
|  |  |  | 0.9 V | 0.9 V | 1.8 V | 1.8 V | 0 V | 1.8 V | 0 V |

Table III shows the gate bias voltages generated by the dynamic gate bias generating circuit 105a corresponding to the enable signal OE, the power supply voltage VDDIO, the logic control signal UP, and the determining signals VL_5 and VL_3. Refer to Table III and FIG. 2. Under the transmitting mode (OE=1.8 V), when the mixed-voltage I/O buffer 100a transmits logic 0 (UP=1.8 V), Vmp1 is as same as VDDIO such that MP1 turns off. That is, when VDDIO is 0.9/1.2/1.8/3.3/5.0 V, Vmp1 is 0.9/1.2/1.8/3.3/5.0 V as well. At that moment, Vmp3 is 1.8 V and Vmp2 is 1.8/1.8/1.8/3.3 V such that MP2 and MP3 turn off and hot-carrier effect happened in the output stage circuit 101a can be thus avoided. On the other hand, when the mixed-voltage I/O buffer 100a transmits logic 1 (UP=0V), Vmp1 is 0/0/0/1.8/3.3 V when VDDIO down the gate voltage of MP207 to 0 V, so that MP207 turns on and thus charges VDDIO_VLC to VDD (i.e. 1.8 V).

The dynamic detecting converter 402 provides the gate voltage Vmn2 for the transistor MN3 of the output stage circuit 101a according to VDDIO so as to modify the duty cycle distortion caused by the decreased voltage differences between the gates and sources ($V_{GS}$) of the stacked PMOS transistors in the output stage circuit 101a when VDDIO is smaller than 1.8 V. When the mixed-voltage I/O buffer 100a operates under the transmitting mode and VDDIO is 5.0/3.3 V, MP605 turns on to turn off MP601. Simultaneously, MP604 turns on and Vmn2 is charged to VDD (or 1.8 V) through MP603 and MP604. When VDDIO is 0.9/1.2/1.8 V, Vmn2 is charged to VDDIO through MP601, MP602 and MP603 to decrease the voltage differences between the gates and sources ($V_{GS}$) of the stacked PMOS transistors and the stacked NMOS transistors in the output stage circuit 101a. Therefore the duty cycle of the output signal outputted by the output stage circuit 101a can be thus close to 50%.

In regard to the EOS protector 403, when the I/O buffer 100a operates under the transmitting mode, VDDIO is 5.0 V, OE is 1.8 V and VL_5 is 0 V, the gate voltage of MP5 (i.e. Vgate1) and the gate voltage of MP4 (i.e. Vgate2) become UP_ (inverse logic to UP) after the operations of NOR1, MN7, MP7, MN8 and MN6. MP4 and MP5 thus turn on without gate-oxide overstress, so as to provide the appropriate gate bias voltage Vmp3 of 5.0 V to 3.3 V for MP3 in the output stage circuit 101a. At the moment, Vmp3 is determined by the node Vmp3_ini.

When the I/O buffer 100a operates under the transmitting mode, VDDIO is 3.3/1.8/1.2/0.9 V, OE is 1.8 V and VL_5 is 1.8 V, Vgate1 and Vgate2 are 0 V such that MP4 and MP5 turn on to provide the appropriate gate bias voltage Vmp3 of 1.8 V to 0 V for MP3 in the output stage circuit 101a.

When the I/O buffer 100a operates under the receiving mode and OE is 0 V, MN7 and MP7 thus turn off such that Vgate1 and Vgate2 are determined by the voltage of the I/O pad 110. When the voltage of the I/O pad 110 is 5.0/3.3 V, Vmn1 is 3.3/2 V and Vmp3 is pulled up to 5.0/3.3 V due to the gate-tracking circuit 107a. Then, MP6 turns on to charge Vgate1 to 5.0/3.3 V and MP5 thus turns off to prevent from the high voltage of the I/O pad 110. At the moment, Vgate2 is pulled down through MN6 to 3.3/2 V and MP4 turns off to avoid gate-oxide overstress. On the other hand, when the voltage of the I/O pad 110 is 0/0.9/1.2/1.8 V, Vgate1 and Vgate2 are charged (or discharged) to 0/0.9/1.2/1.8 V such that MP4 and MP5 turn on and the transistor MP3 in the output stage circuit 101a can receive the voltage of 1.8 V.

The sub-3VDD level converter 404 converts logic 1 (voltage level of 1.8 V) of the terminal UP into 5.0/3.3/1.8/1.2/0.9 V and logic 0 (voltage level of 0 V) into 3.3/1.8/0/0/0 V. When VDDIO is 5.0 V and UP is 0 V, VDDIO_VLC is 3.3 V and VL_5 and VL_3 are 0 V such that MN310 and MN308 turn off, and Vmp1 is discharged through MP305, MP307, MN313 and MP303 such that MP302 turns on and Vmp1x is charged to 5.0 V. At that moment, the gate voltage of MP309 is 1.8V, and Vmp1 is discharged through MN301 and MP309 to 3.3 V. When UP is 1.8 V, the gate voltage of MP308 (i.e. VLC2) is 0 V. At the time, Vmp1 is charged to 5.0 V and Vmp1x is discharged to 3.3 V.

When VDDIO is 3.3 V and UP is 0 V, VDDIO_VLC is 1.8 V and VL_3 is 0 V such that MN308 turns off, and Vmp1 is discharged through MN311, MN309, MN314, MN313 and MP303 such that MP302 turns on to charge Vmp1x to 3.3 V. At that moment, the gate voltage of MP309 is 0 V and Vmp1 is pulled up through MN301 and MP309 to 1.8 V. Similarly, when UP is 3.3 V, Vmp1 is charged to 3.3 V and Vmp1x is discharged to 1.8 V.

When VDDIO is 1.8/1.2/0.9 V and UP is 0 V, VDDIO_VLC is 1.8 V and Vmp1 is discharged through MN311, MN309, MN314, MN307, MN305 and MN303 to 0 V such that MP302 turns on to charge Vmp1x to 1.8/1.2/0.9 V. Similarly, when UP is 1.8 V, Vmp1x is discharged to 0 V and Vmp1 is charged to 1.8/1.2/0.9 V. At that moment, MP309 has a gate voltage of 1.8 V and thus turns off such that the node Vlow_1 is floating and leakage current can be thus avoided.

The sub-2VDD level converter 405 converts logic 1 (having voltage level of 1.8 V) of the terminal UP into 3.3/1.8/1.8/1.8/1.8 V and logic 0 (having voltage level of 0 V) into 1.8/1.8/0/0/0 V. When VDDIO is 5.0 V and UP is 0 V, UP_VL is then 1.8 V and MN205 turns off due to VL_5 of 0 V.

Furthermore, the node Vmp3_is discharged through MP204, MN210 and MN212 such that MP201 turns on. At the moment, the nodes Vmp3_ini and VLC2 (where the drain of MP203 and the drain of MN209 are connected) are charged to 3.3 V through MN201 due to VDDIO_VLC of 3.3 V, and MN202 turns on to pull up the node Vmp3_ (where the source of MN202 and the source of MP204 are connected) to 1.8 V. At the same time, the gate voltage of MP209 is 1.8 V, the node VLC2_ (where the drain of MP204 and the drain of MN210 are connected) is pulled down through MN212 and MN210 to 0 V, and Vmp2 is charged through MP209 to 3.3 V without gate-oxide overstress. On the contrary, when UP is 1.8 V, UP_VL is then 0 V, Vmp3_ini is discharged to 1.8 V, Vmp3_ and VLC2_ are charged to 3.3 V, Vmp2 is charged to 3.3 V, and VLC2 is discharged to 0 V.

When VDDIO is 3.3 V, UP_VL is then 0 V no matter what UP is. If VL_5 is 1.8 V, Vmp3_is discharged through MN204, MN206 and MN208 to 0 V such that MP201 turns on. At the moment, Vmp3_ini is charged through MP201 to 1.8 V and Vmp2 is charged through MP209 to 1.8 V due to VDDIO_VLC of 1.8 V, and MP210 turns off due to VL_5 of 1.8 V to avoid any leakage current.

When VDDIO is 1.8/1.2/0.9 V and UP is 0 V, UP_VL is then 1.8 and Vmp3_ini is discharged through MN203, MN205 and MN207 to 0 V such that MP202 turns on. At the moment, Vmp3_is charged through MP202 to 1.8 V and Vmp2 is pulled down through MN213 to 0 V due to VDDIO_VLC of 1.8 V. Similarly, when UP is 1.8 V, UP_VL is then 0 V, Vmp3_is discharged to 0 V, Vmp3_ini is charged through MP201 to 1.8 V, Vmp2 is charged through MP209 to 1.8 V, and MP210 turns off due to VL_5 of 1.8 V to avoid any leakage current.

Figure 5:
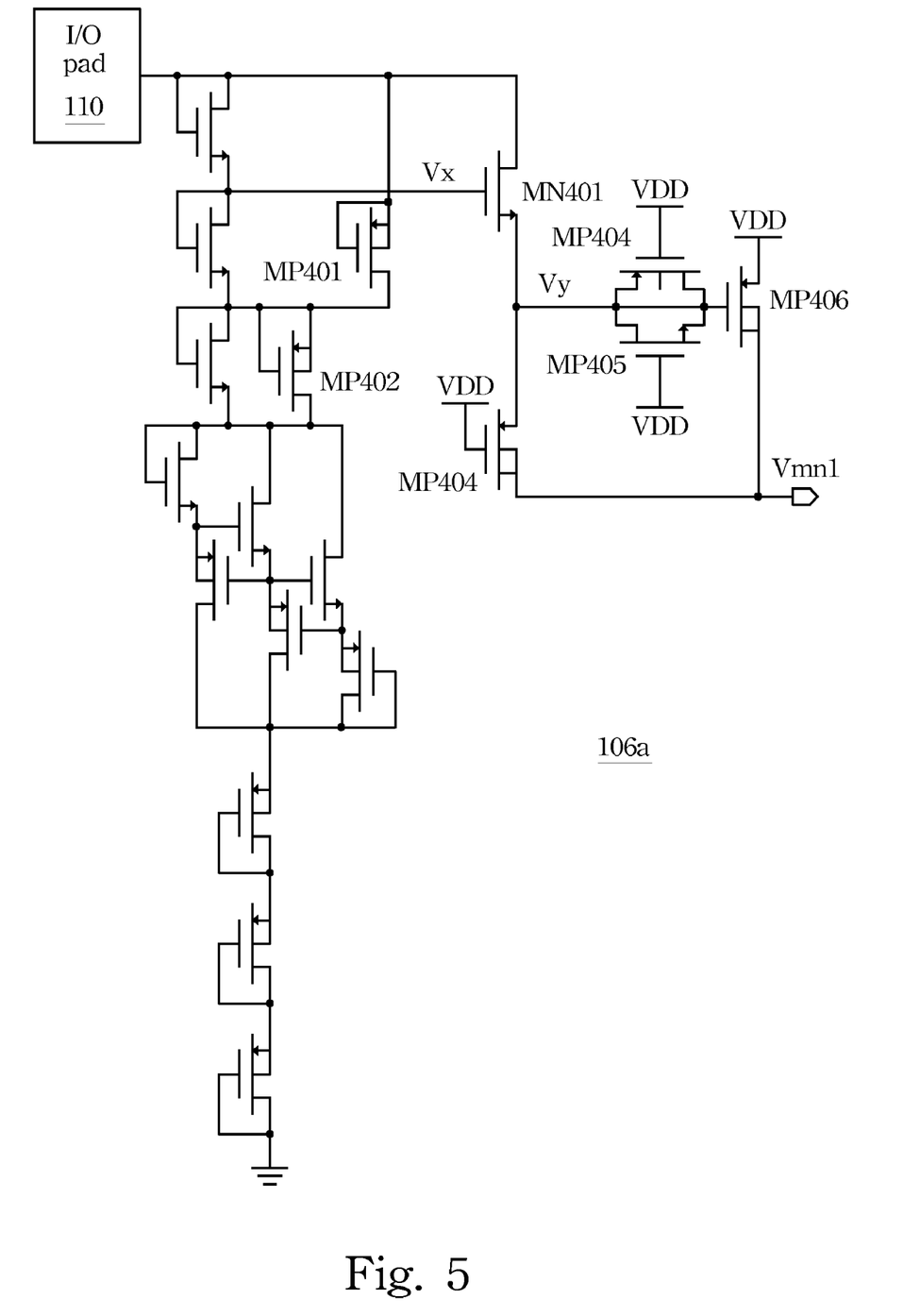
FIG. 5 illustrates a circuit diagram of the pad voltage detector shown in FIG. 2 according to one embodiment of the present invention.

FIG. 5 illustrates a circuit diagram of the pad voltage detector shown in FIG. 2 according to one embodiment of the present invention. The pad voltage detector 106a detects the voltage of the I/O pad 110 and accordingly selects the output signal (or output voltage) delivered to the I/O pad 110. Detailed circuit of the pad voltage detector is shown in FIG. 5.

TABLE IV

| PAD | Vmn1 |
|---|---|
| 5.0 V | 3.3 V |
| 3.3 V | 1.8 V |
| 1.8 V | 1.8 V |
| 1.2 V | 1.8 V |
| 0.9 V | 1.8 V |
| 0 V | 1.8 V |

Table IV shows the I/O pad voltage and the voltage of Vmn1 corresponding to the I/O pad voltage. When the I/O pad voltage is 5.0 V, the node Vx has a voltage of about 4.2 V and Vmn1 is charged through MP404 and MN401 to 3.3 V ($\approx VX-Vt_{MN401}$) for MN1 in the output stage circuit 101a to avoid the gate-oxide overstress of MN1. At the moment, the node Vy has a voltage of about 3.3 V such that MP403 turns on and MP406 turns off to prevent MP406 from generating any leakage current.

When the I/O pad voltage is 3.3/1.8/1.2/0.9 V, the voltage of the node Vy is lower than 1.8 V and Vmn1 is charged through MP406 to 1.8 V. When the I/O pad voltage is 0 V, the node Vy is discharged through MP401 and MP402 so as to avoid gate-oxide overstress. At the moment, Vmn1 is charged through MP406 to 1.8 V.

Figure 6:
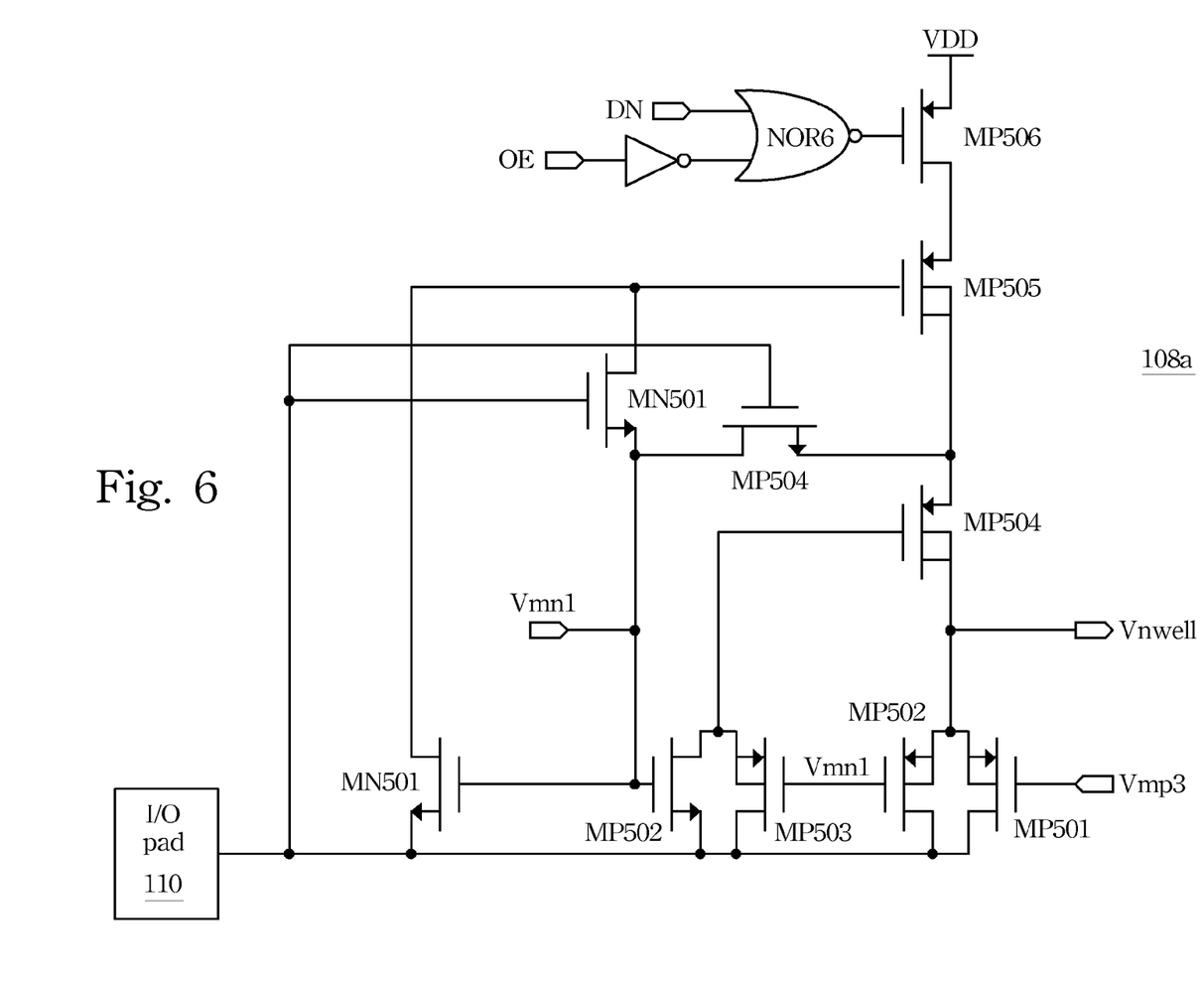
FIG. 6 illustrates a circuit diagram of the floating N-well circuit shown in FIG. 2 according to one embodiment of the present invention.

FIG. 6 illustrates a circuit diagram of the floating N-well circuit shown in FIG. 2 according to one embodiment of the present invention. Referring to FIGS. 2 and 6, the floating N-well circuit 108a controls the N-well voltages of the transistor MP3 in the output stage circuit 101a and the transistors MP5 and MP8 in the gate-tracking circuit 107a, thereby avoiding leakage current generated when the parasitic diodes (e.g. P+/N-well diode) of the transistors are conducted and thereby preventing the output stage circuit 101a from having body effect. Detailed circuit of the floating N-well circuit is shown in FIG. 6.

When the I/O buffer 100a operates under the transmitting mode and transmits the signal with voltage level of 0.9/1.2/1.8 V, Vmp3 is 0 V such that MP501 turns on and Vnwell has a same voltage as the I/O pad voltage. Thus, the N-well voltage of MP3 is the same as the voltages of its source and drain. As a result, MP3 has no body effect and its driving ability can be accordingly increased. At that moment, MP506 has a gate voltage of 1.8 V and turns off to avoid current leakage.

When the I/O buffer 100a operates to transmit logic 0, Vmn1 and Vmp3 are 1.8 V, and MP501 and MP502 turns off, such that Vnwell is charged through MP506, MP505 and MP504 to VDD (or 1.8 V)

When the voltage of the I/O pad 110 is 5.0/3.3 V and Vmn1 is 3.3/1.8 V, MP502 and MP503 turn on such that Vnwell is charged through MP502 to 5.0/3.3 V. At the moment, MP504 turns off such that the parasitic diode of MP3 in the output stage circuit 101a cannot be conducted, thereby effectively avoiding current leakage.

When the I/O buffer 100a operates under the receiving mode and the voltage of the I/O pad 110 is 0/0.9/1.2/1.8 V, Vmn1 and Vmp3 are 1.8 V, and MP501 and MP503 turns off, such that Vnwell is charged through MP506, MP505 and MP504 to VDD (or 1.8 V)

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An output buffer circuit, comprising:
    a high voltage detecting circuit for detecting a power supply with at least three selectable voltage levels and generating a first and a second determining signals and a first and a second bias voltages according to the power supply;
    a dynamic gate bias generating circuit biased by the first and the second bias voltages and receiving the first and the second determining signals, for converting logic control signals into corresponding gate bias voltages according to the first and the second determining signals;
    an output stage circuit comprising three P-type transistors stacked one by one and three N-type transistors stacked one by one, at least one of the P-type transistors and at least one of the N-type transistors being biased by the gate bias voltages, for outputting an output signal with the selectable voltage levels to an I/O pad; and
    a pad voltage detector for detecting a voltage of the I/O pad and providing a pad voltage detecting signal for the output stage circuit to modify the output signal outputted to the I/O pad.

2. The output buffer circuit as claimed in claim 1, wherein the high voltage detecting circuit further comprises:
    a first sub-voltage detecting circuit for detecting if the power supply being a first sub-voltage and outputting the first determining signal to the dynamic gate bias generating circuit; and
    a second sub-voltage detecting circuit for detecting if the power supply being a second sub-voltage and outputting the second determining signal to the dynamic gate bias generating circuit.

3. The output buffer circuit as claimed in claim 1, wherein the high voltage detecting circuit further comprises:
    a low power bias circuit comprising a closed-loop circuit consisting of a plurality of transistors operating in sub-threshold region when being started.

4. The output buffer circuit as claimed in claim 1, wherein the dynamic gate bias generating circuit further comprises:
    a dynamic detecting converter biased by the first bias voltage, for converting one of the logic control signals according to the first determining signal and the power supply into a first gate bias voltage of the gate bias voltages for the output stage circuit.

5. The output buffer circuit as claimed in claim 1, wherein the dynamic gate bias generating circuit further comprises:
    an electrical overstress (EOS) protector for keeping the dynamic gate bias generating circuit from a high voltage of the I/O pad.

6. The output buffer circuit as claimed in claim 1, wherein the dynamic gate bias generating circuit further comprises:
    a power supply detecting level converter biased by the second bias voltage and receiving the second determining signal, for generating a conversion voltage corresponding to the power supply.

7. The output buffer circuit as claimed in claim 6, wherein the dynamic gate bias generating circuit further comprises:
    a first sub-voltage level converter receiving the conversion voltage, for converting a voltage level of a first logic control signal of the logic control signals into a first sub-voltage level according to the conversion voltage; and
    a second sub-voltage level converter receiving the conversion voltage, for converting the voltage level of the first logic control signal into a second sub-voltage level according to the conversion voltage and for generating complementary voltage signals.

8. The output buffer circuit as claimed in claim 1, further comprising:
    a floating N-well circuit for providing N-well voltages for at least one N-well of the stacked transistors in the output stage circuit.

9. The output buffer circuit as claimed in claim 1, further comprising:
    a gate-tracking circuit for tracking the voltage of the I/O pad and controlling at least one of the P-type transistors and at least one of the three N-type transistors in the output stage circuit according to the voltage of the I/O pad.

10. A mixed-voltage input/output (I/O) buffer, comprising:
    an output buffer circuit for buffering signals from a core circuit to an I/O pad under a transmitting mode, comprising:
        a high voltage detecting circuit for detecting a power supply with at least three selectable voltage levels and generating a first and a second determining signals and a first and a second bias voltages according to the power supply;
        a dynamic gate bias generating circuit biased by the first and the second bias voltages and receiving the first and the second determining signals, for converting logic control signals into corresponding gate bias voltages according to the first and the second determining signals;

an output stage circuit comprising three P-type transistors stacked one by one and three N-type transistors stacked one by one, at least one of the P-type transistors and at least one of the N-type transistors being biased by the gate bias voltages, for outputting an output signal with the selectable voltage levels to the I/O pad; and an input buffer circuit for buffering signals from the I/O pad to the core circuit under a receiving mode.

11. The mixed-voltage I/O buffer as claimed in claim 10, further comprising:

a pad voltage detector for detecting a voltage of the I/O pad and modifying the output signal outputted to the I/O pad.

12. The mixed-voltage I/O buffer as claimed in claim 10, wherein the high voltage detecting circuit further comprises:

a first sub-voltage detecting circuit for detecting if the power supply being a first sub-voltage and outputting the first determining signal to the dynamic gate bias generating circuit; and a second sub-voltage detecting circuit for detecting if the power supply being a second sub-voltage and outputting the second determining signal to the dynamic gate bias generating circuit.

13. The mixed-voltage I/O buffer as claimed in claim 12, wherein the high voltage detecting circuit further comprises:

a low power bias circuit comprising a closed-loop circuit consisting of a plurality of transistors operating in sub-threshold region when being started.

14. The mixed-voltage I/O buffer as claimed in claim 10, wherein the dynamic gate bias generating circuit further comprises:

a dynamic detecting converter biased by the first bias voltage, for converting one of the logic control signals according to the first determining signal and the power supply into a first gate bias voltage of the gate bias voltages for the output stage circuit.

15. The mixed-voltage I/O buffer as claimed in claim 14, wherein the dynamic gate bias generating circuit further comprises:

an electrical overstress (EOS) protector for keeping the dynamic gate bias generating circuit from a high voltage of the I/O pad.

16. The mixed-voltage I/O buffer as claimed in claim 15, wherein the dynamic gate bias generating circuit further comprises:

a power supply detecting level converter biased by the second bias voltage and receiving the second determining signal, for generating a conversion voltage corresponding to the power supply.

17. The mixed-voltage I/O buffer as claimed in claim 16, wherein the dynamic gate bias generating circuit further comprises:

a first sub-voltage level converter receiving the conversion voltage, for converting a voltage level of a first logic control signal of the logic control signals into a first sub-voltage level according to the conversion voltage; and a second sub-voltage level converter receiving the conversion voltage, for converting the voltage level of the first logic control signal into a second sub-voltage level according to the conversion voltage and for generating complementary voltage signals.

18. An output buffer circuit, comprising:

a high voltage detecting circuit for detecting a power supply with at least three selectable voltage levels and generating a first and a second determining signals and a first and a second bias voltages according to the power supply;

a dynamic gate bias generating circuit biased by the first and the second bias voltages and receiving the first and the second determining signals, for converting logic control signals into corresponding gate bias voltages according to the first and the second determining signals;

an output stage circuit comprising stacked P-type transistors biased by the gate bias voltages, for outputting an output signal with the selectable voltage levels to an I/O pad;

a gate-tracking circuit for tracking voltage of the I/O pad and providing gate voltages for the output stage circuit according to the voltage of the I/O pad; and a floating N-well circuit for providing N-well voltages for at least one N-well of the stacked P-type transistors and at least one N-well of P-type transistors of the gate-tracking circuit.

19. The output buffer circuit as claimed in claim 18, wherein the high voltage detecting circuit further comprises:

a first sub-voltage detecting circuit for detecting if the power supply being a first sub-voltage and outputting the first determining signal to the dynamic gate bias generating circuit; and a second sub-voltage detecting circuit for detecting if the power supply being a second sub-voltage and outputting the second determining signal to the dynamic gate bias generating circuit.

20. The output buffer circuit as claimed in claim 18, wherein the high voltage detecting circuit further comprises:

a low power bias circuit comprising a closed-loop circuit consisting of a plurality of transistors operating in sub-threshold region, for generating the first and the second bias voltages according to the power supply.

21. The output buffer circuit as claimed in claim 18, wherein the dynamic gate bias generating circuit further comprises:

a dynamic detecting converter biased by the first bias voltage, for converting one of the logic control signals according to the first determining signal and the power supply into a first gate bias voltage of the gate bias voltages for the output stage circuit.

22. The output buffer circuit as claimed in claim 18, wherein the dynamic gate bias generating circuit further comprises:

an electrical overstress (EOS) protector for keeping the dynamic gate bias generating circuit from a high voltage of the I/O pad.

23. The output buffer circuit as claimed in claim 18, wherein the dynamic gate bias generating circuit further comprises:

a power supply detecting level converter biased by the second bias voltage and receiving the second determining signal, for generating a conversion voltage corresponding to the power supply.

24. The output buffer circuit as claimed in claim 23, wherein the dynamic gate bias generating circuit further comprises:

a first sub-voltage level converter receiving the conversion voltage, for converting a voltage level of a first logic control signal of the logic control signals into a first sub-voltage level according to the conversion voltage; and a second sub-voltage level converter receiving the conversion voltage, for converting the voltage level of the first logic control signal into a second sub-voltage level according to the conversion voltage and for generating complementary voltage signals.

25. The output buffer circuit as claimed in claim 18, further comprising:
a pad voltage detector for detecting the voltage of the I/O pad and providing a pad voltage detecting signal for the output stage circuit to modify the output signal outputted to the I/O pad.

26. The output buffer circuit as claimed in claim 25, wherein the gate-tracking circuit is turned on or off according to one of the gate bias voltages from the dynamic gate bias generating circuit, the pad voltage detecting signal and the voltage of the I/O pad.

27. The output buffer circuit as claimed in claim 18, wherein the stacked P-type transistors of the output stage circuit comprise three P-type transistors stacked one by one.

28. The output buffer circuit as claimed in claim 27, wherein the output stage circuit further comprises three N-type transistors stacked one by one.

29. The output buffer circuit as claimed in claim 18, further comprising:
a pre-driving circuit for outputting the logic control signals to the dynamic gate bias generating circuit by receiving an enable signal.

30. A mixed-voltage input/output (I/O) buffer, comprising:
an output buffer circuit for buffering signals from a core circuit to an I/O pad under a transmitting mode, comprising:
a high voltage detecting circuit for detecting a power supply with at least three selectable voltage levels and generating a first and a second determining signals and a first and a second bias voltages according to the power supply;
a dynamic gate bias generating circuit biased by the first and the second bias voltages and receiving the first and the second determining signals, for converting logic control signals into corresponding gate bias voltages according to the first and the second determining signals;
an output stage circuit comprising stacked P-type transistors biased by the gate bias voltages, for outputting an output signal with the selectable voltage levels to the I/O pad;
a gate-tracking circuit for tracking voltage of the I/O pad and providing gate voltages for the output stage circuit according to the voltage of the I/O pad; and
a floating N-well circuit for providing N-well voltages for at least one N-well of the stacked P-type transistors and at least one N-well of P-type transistors of the gate-tracking circuit;
a pad voltage detector for detecting the voltage of the I/O pad and modifying the output signal outputted to the I/O pad; and
an input buffer circuit for buffering signals from the I/O pad to the core circuit under a receiving mode.

31. The mixed-voltage I/O buffer as claimed in claim 30, wherein the high voltage detecting circuit further comprises:
a first sub-voltage detecting circuit for detecting if the power supply being a first sub-voltage and outputting the first determining signal to the dynamic gate bias generating circuit; and
a second sub-voltage detecting circuit for detecting if the power supply being a second sub-voltage and outputting the second determining signal to the dynamic gate bias generating circuit.

32. The mixed-voltage I/O buffer as claimed in claim 31, wherein the high voltage detecting circuit further comprises:
a low power bias circuit comprising a closed-loop circuit consisting of a plurality of transistors operating in sub-threshold region, for generating the first and the second bias voltages according to the power supply.

33. The mixed-voltage I/O buffer as claimed in claim 30, wherein the dynamic gate bias generating circuit further comprises:
a power supply detecting level converter biased by the second bias voltage and receiving the second determining signal, for generating a conversion voltage corresponding to the power supply.

34. The mixed-voltage I/O buffer as claimed in claim 33, wherein the dynamic gate bias generating circuit further comprises:
a first sub-voltage level converter receiving the conversion voltage, for converting a voltage level of a first logic control signal of the logic control signals into a first sub-voltage level according to the conversion voltage; and
a second sub-voltage level converter receiving the conversion voltage, for converting the voltage level of the first logic control signal into a second sub-voltage level according to the conversion voltage and for generating complementary voltage signals.

35. The mixed-voltage I/O buffer as claimed in claim 34, wherein the dynamic gate bias generating circuit further comprises:
a dynamic detecting converter biased by the first bias voltage, for converting one of the logic control signals according to the first determining signal and the power supply into a first gate bias voltage of the gate bias voltages for the output stage circuit.

36. The mixed-voltage I/O buffer as claimed in claim 35, wherein the dynamic gate bias generating circuit further comprises:
an electrical overstress (EOS) protector for keeping the dynamic gate bias generating circuit from a high voltage of the I/O pad.

37. The mixed-voltage I/O buffer as claimed in claim 34, wherein the gate-tracking circuit is turned on or off according to one of the complementary voltage signals, one of the gate bias voltages from the dynamic gate bias generating circuit, the pad voltage detecting signal and the voltage of the I/O pad.

38. The mixed-voltage I/O buffer as claimed in claim 30, wherein the stacked P-type transistors of the output stage circuit comprise three P-type transistors stacked one by one.

39. The mixed-voltage I/O buffer as claimed in claim 38, wherein the output stage circuit further comprises three stacked N-type transistors.

* * * * *